US010644100B2

(12) United States Patent
Wang et al.

(10) Patent No.: US 10,644,100 B2
(45) Date of Patent: May 5, 2020

(54) DUAL-GATE PMOS FIELD EFFECT TRANSISTOR WITH INGAAS CHANNEL

(71) Applicant: Institute of Microelectronics, Chinese Academy of Sciences, Beijing (CN)

(72) Inventors: Shengkai Wang, Beijing (CN); Honggang Liu, Beijing (CN); Bing Sun, Beijing (CN); Hudong Chang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 15/539,478

(22) PCT Filed: Dec. 28, 2016

(86) PCT No.: PCT/CN2016/112627
§ 371 (c)(1),
(2) Date: Jun. 23, 2017

(87) PCT Pub. No.: WO2018/068406
PCT Pub. Date: Apr. 19, 2018

(65) Prior Publication Data
US 2019/0229182 A1    Jul. 25, 2019

(30) Foreign Application Priority Data
Oct. 12, 2016    (CN) .......................... 2016 1 0890501

(51) Int. Cl.
*H01L 31/06*    (2012.01)
*H01L 29/66*    (2006.01)
(Continued)

(52) U.S. Cl.
CPC ........ *H01L 29/0603* (2013.01); *H01L 29/205* (2013.01); *H01L 29/4232* (2013.01);
(Continued)

(58) Field of Classification Search
CPC ........... H01L 29/0603; H01L 29/66484; H01L 29/66666; H01L 29/7827; H01L 29/7832
See application file for complete search history.

(56) References Cited

U.S. PATENT DOCUMENTS 5,798,555 A    8/1998  Mishra et al.
6,265,260 B1 *  7/2001  Alers .................... H01L 28/40
                                          438/240

(Continued)

FOREIGN PATENT DOCUMENTS

| CN | 102610640 A | 7/2012 |
| CN | 102931231 A | 2/2013 |
| CN | 104201199 A | 12/2014 |

OTHER PUBLICATIONS

"International Application No. PCT/CN2016/112627, International Search Report dated Jul. 10, 2017", w/ English Translation, (Jul. 10, 2017), 6 pgs.

*Primary Examiner* — Alonzo Chambliss
(74) *Attorney, Agent, or Firm* — Schwegman Lundberg & Woessner, P.A.

(57) ABSTRACT

The present disclosure relates to the field of semiconductor Integrated Circuit (IC) manufacture, and provides an InGaAs-based double-gate PMOS Field Effect Transistor (FET). The FET includes a bottom gate electrode, a bottom gate dielectric layer, a bottom gate interface control layer, an InGaAs channel layer, an upper interface control layer, a highly doped P-type GaAs layer, an ohmic contact layer, source/drain metal electrodes, a top gate dielectric layer and a top gate electrode. The source/drain metal electrodes are located on opposite sides of the ohmic contact layer. A gate trench structure is etched to an upper surface of the interface control layer between the source and drain metal electrodes. The top gate dielectric layer uniformly covers an inner surface of the gate trench structure, and the top gate elec- (Continued)

trode is provided on the top gate dielectric layer. The present disclosure provides a PMOS FET with better gate control functionality and a low interface density with the double-gate structure and interface control layer design, in order to meet the requirements of high-performance PMOS transistors.

13 Claims, 2 Drawing Sheets

(51) Int. Cl.
| | |
|---|---|
| H01L 21/336 | (2006.01) |
| H01L 29/06 | (2006.01) |
| H01L 29/78 | (2006.01) |
| H01L 29/778 | (2006.01) |
| H01L 29/205 | (2006.01) |
| H01L 29/423 | (2006.01) |

(52) U.S. Cl.
CPC .... *H01L 29/4236* (2013.01); *H01L 29/66484* (2013.01); *H01L 29/66666* (2013.01); *H01L 29/7783* (2013.01); *H01L 29/7827* (2013.01); *H01L 29/7832* (2013.01)

(56) References Cited

U.S. PATENT DOCUMENTS

| | | | | |
|---|---|---|---|---|
| 8,907,320 | B2* | 12/2014 | Hwang | H01L 33/04 257/13 |
| 2013/0180564 | A1* | 7/2013 | Hekmatshoartabari | H01L 31/075 136/244 |
| 2014/0042455 | A1 | 2/2014 | Chyi et al. | |
| 2015/0279997 | A1* | 10/2015 | Koldiaev | H01L 21/845 257/401 |
| 2019/0157488 | A1* | 5/2019 | Hekmatshoartabari | H01L 31/075 |

\* cited by examiner

DUAL-GATE PMOS FIELD EFFECT TRANSISTOR WITH INGAAS CHANNEL

PRIORITY APPLICATIONS

This application is a U.S. National Stage Filing under 35 U.S.C. 371 from International Application No. PCT/CN2016/112627, filed on 28 Dec. 2016, and published as WO2018/068406 A1 on Apr. 19, 2018, which claims the benefit of priority to Chinese Application No. 201610890501.0, filed on 12 Oct. 2016; which applications and publication are incorporated herein by reference in their entirety.

TECHNICAL FIELD

The present disclosure relates to the field of semiconductor Integrated Circuit (IC) manufacture, and more specifically, relates to a dual-gate PMOS Field Effect Transistor (FET) with an InGaAs channel, which is applicable to high-performance group III-V CMOS devices.

BACKGROUND

The existing silicon-based Integrated Circuit (IC) technology follows Moore's Law to improve performances by scaling down, which will bring about the complexity of equipments and processes. Especially when the semiconductor technology is developed to the nanometer scale, the silicon-based IC technology is increasingly approaching both theoretic and technical limits. The use of new materials and new device structures to continue to improve the performances of CMOS devices has become an important research trend. Group III-V semiconductors have higher electron mobility and very good transport properties in either a low electric field or a strong field, and thus become a current research hotspot. In addition, the group III-V semiconductors have a series of lattice-matched heterojunction material systems, and thus both energy band engineering and impurity engineering can be flexibly applied while designing the devices. However, for InGaAs-based PMOS devices, due to the lower hole mobility, there are still some problems to be solved to achieve high performance PMOS devices. At a surface of the group III-V semiconductor, it is needed to reduce the MOS interface state density to improve the carrier mobility in the channel. However, it is difficult for the traditional device structure to meet the requirements of high performance.

Therefore, there is a need for a new method and structure to achieve high performance InGaAs-based PMOS devices to meet the requirements of the group III-V CMOS technology.

SUMMARY

CMOS devices in traditional configuration, due to continuous scaling down of Integrated Circuits (IC), encounter problems such as a low operating current, highly scattering of carriers, a high interface state density etc., limiting further research and development of such devices. In view of this, the present disclosure provides a double gate structure with high carrier mobility and also an interface control layer with a low interface state density that is bonded to a bottom gate dielectric layer, to meet the performance requirements of the high performance group III-V CMOS technology.

In order to achieve the above object, the present disclosure provides a InGaAs-based double gate PMOS Field Effect Transistor (FET) including a bottom gate electrode, an interface control layer, and a top gate electrode.

A InGaAs-based double gate PMOS FET includes a bottom gate structure, an InGaAs channel layer, a top gate structure, a lower interface control layer and an upper interface control layer. The lower interface control layer is disposed between the bottom gate structure and the InGaAs Channel layer, and the upper interface control layer is disposed between the top gate structure and the InGaAs channel layer.

The upper interface control layer and the lower interface control layer each have a thickness in a range between a single atomic layer and 20 nm.

The lower interface control layer and the upper interface control layer each have a bandgap greater than that of the InGaAs channel layer, Due to this, it is possible to passivate dangling bonds at the MOS interface, to achieve a low interface state density and reduce scattering of carriers in the channel. Further, the upper interface control layer and the lower interface control layer each have a first type of quantum well band alignment relationship with the InGaAs channel layer.

The InGaAs channel layer has a thickness of 1 to 20 nm, with a low In composition between 0.2 to 0.4, in order to facilitate the decrease in an off current of the device.

The bottom gate structure includes a bottom gate electrode and a bottom gate dielectric layer.

The bottom gate electrode includes an electrode metal layer and a work function layer.

The top gate structure includes a top gate electrode, a top gate dielectric layer, an ohmic contact layer, a highly doped P-type GaAs layer and source/drain metal electrodes.

The top gate electrode includes an electrode metal layer and a work function layer.

A lattice of the highly doped P-type GaAs layer has a matching or pseudo-mating relationship with that of the InGaAs channel layer.

The highly doped P-type GaAs layer has a doping concentration greater than $1e^{18}$ cm$^{-3}$.

The ohmic contact layer includes a heavily doped InGaAs material with a doping concentration greater than $1e^{19}$ cm$^{-3}$.

Holes in the InGaAs channel layer have a quantum confinement effect.

The top gate dielectric layer uniformly covers an inner surface of a gate trench structure formed in the ohmic contact layer and the highly doped GaAs layer. The top gate electrode is disposed on the top gate dielectric layer, and the source/drain metal electrodes are disposed on opposite ends of the ohmic contact layer.

The top gate dielectric layer and the bottom gate dielectric layer each have a dielectric constant K greater larger than 8.

The top gate dielectric layer and the bottom gate dielectric layer each include a material selected form oxide, nitride, oxynitride, any mixture thereof, or any combination of multiple layers thereof.

According to the embodiments, the present disclosure has various advantages, some of which is described as follows. In the InGaAs PMOS FET according to the present disclosure, it is possible to improve gate control functionality of the device and increase an operating current of the device by the double gate device structure. Further, it is possible to achieve higher carrier mobility by reducing an interface state density with the interface control layer and reducing scattering of the carriers in the channel. Furthermore, an equivalent oxide layer thickness (EOT) can be reduced by combing the interface control layer and the high dielectric constant gate dielectric. Therefore, it is possible to achieve a InGaAs-based double-gate PMOS FET with a low interface state density and a high operating current, to meet the requirements of the high-performance group III-V CMOS technology.

BRIEF DESCRIPTION OF THE DRAWINGS

In FIG. 1: a bottom gate electrode (101), a bottom gate dielectric layer (102), a lower interface control layer (103), an InGaAs channel layer (104), an upper interface control layer (105), a highly doped P-type GaAs Layer (106), an ohmic contact layer (107), source/drain metal electrodes (108) (109), a top gate dielectric layer (110), and a top gate electrode (111).

DETAILED DESCRIPTION

To make objects, features and advantages of the present disclosure more apparent, the present disclosure will be described in further detail with reference to the accompanying drawings.

Figure 1:
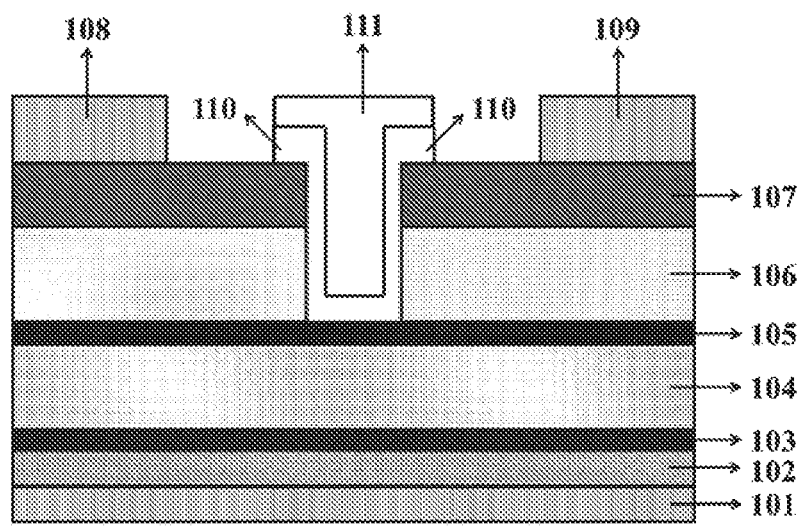
FIG. 1 is a structure schematic diagram showing a InGaAs-based double-gate PMOS Field Effect Transistor (FET) with a low interface state density and a high operating current according to an embodiment of the present disclosure.

FIG. 1 is a structure schematic diagram showing an InGaAs-based double-gate PMOS Field Effect Transistor (FET) according to an embodiment. As shown in FIG. 1, the FET comprises a bottom gate electrode (101), a bottom gate dielectric layer (102) on the bottom gate electrode (101), a lower interface control layer (103) on the bottom gate dielectric layer (102), an InGaAs channel layer (104) on the lower interface control layer (103), an upper interface control layer (105) on the InGaAs channel layer, a highly doped P-type GaAs layer (106) on the upper interface control layer (105), an ohmic contact layer (107) on the highly doped GaAs layer (106), source/drain metal electrodes (108) (109) formed on the ohmic contact layer (107). The ohmic contact layer (107) and the highly doped P-type GaAs layer (106) are etched to a surface of the upper interface control Layer (105) between the source/drain metal electrodes, thereby forming a gate trench structure. The FET further comprises a top gate dielectric layer (110) formed in the gate trench structure, and a top gate electrode (111) formed on the top gate dielectric layer (110).

A top gate structure includes the top gate electrode (11) and the top gate dielectric layer (110). There are also provided the drain/source metal electrodes (108) (109), the ohmic contact layer (107), and the highly doped P-type GaAs layer (106). A bottom gate structure includes the bottom gate electrode (101) and the bottom gate dielectric layer (102). The top gate electrode (111) and the bottom gate electrode (101) each include an electrode metal layer and a work function layer, in which the work function layer is used to adjust a threshold voltage of the device.

The bottom gate dielectric layer (102) has a dielectric constant K greater than 8. The bottom gate dielectric layer (102) includes a material selected from oxide, nitride, oxynitride, any mixture thereof, or any combination of multiple layers thereof.

The upper interface control layer (105) and the lower interface control layer (103), each having a bandgap greater than that of the InGaAs channel layer (104), can passivate dangling bonds at the MOS interface to achieve a low interface state density and reduce scattering of carriers in the channel. The upper interface control layer (105) and the lower interface control layer (103) each have a thickness in a range between a single atomic layer and 20 nm.

The InGaAs channel layer (104) used has a thickness of 1 to 20 nm, with a low In composition, between 0.2 and 0.4, in order to facilitate the decrease in an off current of the device.

Lattices of the upper interface control layer (105) and the lower interface control layer (103) have a matching or pseudo-mating relationship with that of the InGaAs channel. The upper interface control layer (105) and the lower interface control layer (103) have a first type of quantum well band alignment relationship with the InGaAs channel. Holes in the InGaAs channel layer (104) have a quantum confinement effect.

The highly doped P-type GaAs layer (106) has a doping concentration greater than $1e^{18}$ $cm^{-3}$.

The ohmic contact layer (107) includes a heavily doped InGaAs material, with a doping concentration greater than $1e^{19}$ $cm^{-3}$.

The gate trench structure is formed between the source and drain metal electrodes (108) (109). Etching of the gate trench is automatically stopped on the surface of the upper interface control layer (105) by adopting the selective etching technique.

The top gate dielectric layer (110) is formed on an inner surface of the gate trench structure, and the bottom gate dielectric layer (102) is formed on a surface of the lower interface control layer (103).

According to an embodiment of the present disclosure, the InGaAs-based double-gate PMOS FET illustrated in FIG. 1 can be fabricated by a method described in detail below. The method comprises the following steps:

Step 1: epitaxially growing a group III-V semiconductor buffer layer on a single crystal GaAs substrate;

Step 2: epitaxially growing an etch stop layer on the semiconductor buffer layer to facilitate protecting other epitaxial layers while etching the GaAs substrate during the process;

Step 3: epitaxially growing an InGaAs material for an ohmic contact layer (107) and a GaAs material for a highly doped P-type GaAs layer (106) in this sequence on the etch stop layer:

Step 4: epitaxially growing then a lower interface control layer (103), an InGaAs channel layer (104), and an upper interface control layer (105), wherein the InGaAs channel layer (104) is disposed between the upper interface control layer (105) and the lower interface control layer (103), the lower interface control layer (103) and the upper interface control layer (105) each have a bandgap greater than that of the InGaAs channel layer (104) and passivate dangling bonds at the interface to achieve a low interface state density;

Step 5: depositing a material for a top gate dielectric layer (110) on the upper interface control layer (105), by a method of, for example, Atomic Layer Deposition (ALD);

Step 6: depositing a top gate electrode (111) on the top gate dielectric layer (110) to form a top gate electrode for the double gate device, the top gate electrode including an electrode metal layer, a work function layer, and a low resistance gate electrode layer;

Step 7: bonding the back gate electrode onto a single crystal substrate that includes silicon or a group III-V semiconductor substrate by way of bonding;

Step 8: etching the GaAs substrate to the etch stop layer to form source/drain structures, by way of for example, wet or dry selective etching;

Step 9: depositing a material for a top gate dielectric (110) in the gate trench structure formed due to the etching, followed by depositing a top gate electrode (111) on a surface of the top gate dielectric layer (110);

Step 10: depositing source/drain metal electrodes (108) (109), which form a good ohmic contact with the highly doped ohmic contact layer (107) to meet the requirements of high performance PMOS devices.

Figure 2:
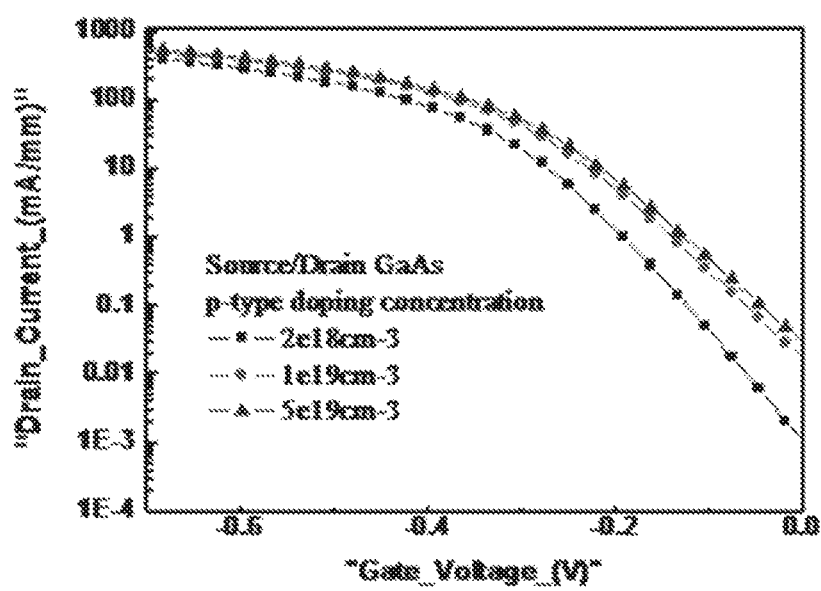
FIG. 2 is a transfer characteristic curve of the device obtained by TCAD simulation.

FIG. 2 shows a transfer characteristic curve of the above device obtained by TCAD simulation. 40 nm InGaAs-based double-gate PMOS transistor developed according to the present disclosure can work at 0.7V, with a current ON/OFF ratio greater than 100000 and an ON current greater than 500 mA/mm, showing superior high speed and low power consumption characteristics. Therefore, this InGaAs-based dual-gate PMOS FET according to the present disclosure improves gate control functionality of the device and increases an operating current of the device by the double gate device structure. Further, this device can achieve higher carrier mobility by reducing the interface state density with the interface control layer and reducing scattering of the carriers in the channel. Furthermore, an equivalent oxide layer thickness (EOT) can be reduced by combing the interface control layer and the high dielectric constant gate dielectric. Therefore, it is possible to achieve a InGaAs-based double-gate PMOS FET with a low interface state density and a high operating current, to meet the requirements of the high-performance group III-V CMOS technology.

Specific embodiments as described above have further described the objects, features and advantages of the present disclosure. It is to be understood that the above description illustrates only specific embodiments of the present disclosure and is not intended to limit the present disclosure. It is possible to make various changes, equivalents, improvements, or the like without departing from the spirit and principles of the present disclosure, which all fall in the scope of the present disclosure.

We claim:

1. A Field Effect Transistor (FET), comprising:
   a bottom gate structure comprising a bottom gate electrode and a bottom gate dielectric layer;
   an InGaAs channel layer;
   a top gate structure comprising a top gate electrode and a top gate dielectric layer different from the bottom gate electrode and bottom gate dielectric layer; and
   a lower interface control layer and an upper interface control layer,
   wherein the bottom gate dielectric layer is disposed between the bottom gate electrode and the InGaAs channel layer, and the top gate dielectric layer is disposed between the top gate electrode and the InGaAs channel layer,
   wherein the lower interface control layer is disposed between the bottom gate dielectric layer and the InGaAs channel layer, and the upper interface control layer is disposed between the top gate structure and the InGaAs channel layer, and
   wherein the upper interface control layer and the lower interface control layer each have a bandgap greater than that of the InGaAs channel layer, and the upper interface control layer and the lower interface control layer each has a first type of quantum well band alignment relationship with the InGaAs channel layer, and
   wherein the upper interface control layer and the lower interface control layer each have a thickness in a range between a single atomic layer and 20 nm.

2. The FET according to claim 1, wherein the InGaAs channel layer has a thickness of 1 to 20 nm, with a low In composition between 0.2 and 0.4.

3. The FET according to claim 1, wherein holes in the InGaAs channel layer have a quantum confinement effect.

4. The FET according to claim 1, wherein the bottom gate electrode comprises an electrode metal layer and a work function layer.

5. The FET according to claim 1, further comprising:
   highly doped P-type GaAs layers disposed on the upper interface control layer on opposite sides of the top gate structure, respectively,
   ohmic contact layers disposed on the highly doped P-type GaAs layers, respectively, and source/drain metal electrodes disposed on the ohmic contact layers, respectively.

6. The FET according to claim 5, wherein each of the ohmic contact layer comprises a heavily doped InGaAs material with a doping concentration greater than $1e^{19}$ cm$^{-3}$.

7. The FET according to claim 5, wherein each of the highly doped P-type GaAs layer has a doping concentration greater than $1e^{18}$ cm$^{-3}$.

8. The FET according to claim 5, wherein each of the upper interface control layer and the lower interface control layer has a lattice having a matching or pseudo-mating relationship with that of the InGaAs channel layer.

9. The FET according to claim 5, wherein the top gate dielectric layer uniformly extends on a surface of the upper interface control layer between the highly doped P-type GaAs layers opposite to each other, surfaces of the highly doped P-type GaAs layers facing each other, and surfaces of the ohmic contact layers facing each other.

10. The FET according to claim 1, wherein the top gate electrode comprises an electrode metal layer and a work function layer.

11. The FET according to claim 1, wherein the top gate dielectric layer and the bottom gate dielectric layer each have a dielectric constant K greater than 8.

12. The FET according to claim 11, wherein the top gate dielectric layer and the bottom gate dielectric layer each comprises a material selected from oxide, nitride, oxynitride, any mixture thereof, or any combination of multiple layers thereof.

13. A Field Effect Transistor (FET), comprising:
   a bottom gate structure comprising a bottom gate electrode and a bottom gate dielectric layer;
   an InGaAs channel layer having a thickness of 1 to 20 nm,
   a top gate structure comprising a top gate electrode and top gate dielectric layer, wherein the top gate electrode and top gate dielectric layer are different from the bottom gate electrode and bottom gate dielectric layer; and
   a lower interface control layer and an upper interface control layer wherein the upper interface control layer and the lower interface control layer each have a thickness in a range between a single atomic layer and 20 nm and wherein the upper interface control layer and the lower interface control layer both have a lattice having a matching or pseudo-mating relationship with that of the InGaAs channel layer,
   wherein the bottom gate dielectric layer is disposed between the bottom gate electrode and the InGaAs channel layer, and the top gate dielectric layer is disposed between the top gate electrode and the InGaAs channel layer, wherein the lower interface control layer is disposed between the bottom gate dielectric layer and the InGaAs channel layer, and the upper interface control layer is disposed between the top gate dielectric layer and the InGaAs channel layer, and wherein the upper interface control layer and the lower interface control layer each have a bandgap greater than that of the InGaAs channel layer, and the upper interface control layer and the lower interface control layer each has a first type of quantum well band alignment relationship with the InGaAs channel layer.

* * * * *